United States Patent
Jain et al.

(10) Patent No.: US 10,199,536 B2
(45) Date of Patent: Feb. 5, 2019

(54) PATTERNED LAYER DESIGN FOR GROUP III NITRIDE LAYER GROWTH

(71) Applicant: Sensor Electronic Technology, Inc., Columbia, SC (US)

(72) Inventors: Rakesh Jain, Columbia, SC (US); Wenhong Sun, Lexington, SC (US); Jinwei Yang, Columbia, SC (US); Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/633,141

(22) Filed: Jun. 26, 2017

(65) Prior Publication Data

US 2017/0287698 A1    Oct. 5, 2017

Related U.S. Application Data

(63) Continuation of application No. 14/822,508, filed on Aug. 10, 2015, now Pat. No. 9,691,939, which is a
(Continued)

(51) Int. Cl.
*H01L 33/12*    (2010.01)
*H01L 33/22*    (2010.01)
(Continued)

(52) U.S. Cl.
CPC .............. *H01L 33/12* (2013.01); *C30B 25/04* (2013.01); *C30B 25/183* (2013.01);
(Continued)

(58) Field of Classification Search
CPC ... H01L 21/02647; H01L 33/12; H01L 33/24; H01L 33/32; C30B 25/04; C30B 23/02; C30B 23/04
See application file for complete search history.

(56) References Cited

U.S. PATENT DOCUMENTS

| | | | |
|---|---|---|---|
| 4,952,526 A | 8/1990 | Pribat et al. | |
| 5,679,152 A | * 10/1997 | Tischler | ................. B82Y 15/00 117/1 |

(Continued)

FOREIGN PATENT DOCUMENTS

| | | |
|---|---|---|
| JP | 2002255694 A | 9/2002 |
| JP | 2006278477 A | 10/2006 |

(Continued)

OTHER PUBLICATIONS

Lee, H., U.S. Appl. No. 15/389,479, Notice of Allowance, dated Jul. 6, 2017, 13 pages.
(Continued)

*Primary Examiner* — Tucker J Wright
(74) *Attorney, Agent, or Firm* — LaBatt, LLC

(57) ABSTRACT

A method of fabricating a device using a layer with a patterned surface for improving the growth of semiconductor layers, such as group III nitride-based semiconductor layers with a high concentration of aluminum, is provided. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the
(Continued)

characteristic size of the stress reducing regions. A device including one or more of these features also is provided.

20 Claims, 19 Drawing Sheets

Related U.S. Application Data continuation-in-part of application No. 13/647,902, filed on Oct. 9, 2012, now Pat. No. 9,105,792.

(60) Provisional application No. 61/545,261, filed on Oct. 10, 2011, provisional application No. 61/556,160, filed on Nov. 4, 2011.

(51) Int. Cl.

| | | |
|---|---|---|
| *H01L 33/32* | (2010.01) | |
| *H01L 33/24* | (2010.01) | |
| *H01L 21/02* | (2006.01) | |
| *H01L 29/20* | (2006.01) | |
| *H01L 29/778* | (2006.01) | |
| *C30B 25/04* | (2006.01) | |
| *C30B 25/18* | (2006.01) | |
| *C30B 29/40* | (2006.01) | |
| *H01L 29/205* | (2006.01) | |
| *H01L 33/06* | (2010.01) | |
| *H01L 33/10* | (2010.01) | |
| *H01L 33/14* | (2010.01) | |
| *H01L 33/40* | (2010.01) | |
| *H01L 29/51* | (2006.01) | |

(52) U.S. Cl.
CPC ........ *C30B 29/406* (2013.01); *H01L 21/0242* (2013.01); *H01L 21/0243* (2013.01); *H01L 21/0254* (2013.01); *H01L 21/0265* (2013.01); *H01L 21/02458* (2013.01); *H01L 21/02639* (2013.01); *H01L 29/2003* (2013.01); *H01L 29/205* (2013.01); *H01L 29/7786* (2013.01); *H01L 29/7787* (2013.01); *H01L 33/06* (2013.01); *H01L 33/10* (2013.01); *H01L 33/145* (2013.01); *H01L 33/22* (2013.01); *H01L 33/24* (2013.01); *H01L 33/32* (2013.01); *H01L 33/405* (2013.01); *H01L 29/518* (2013.01); *H01L 2933/0091* (2013.01)

(56) References Cited

U.S. PATENT DOCUMENTS

| | | | |
|---|---|---|---|
| 6,111,277 A | 8/2000 | Ikeda | |
| 6,153,010 A | 11/2000 | Kiyoku et al. | |
| 6,294,440 B1 | 9/2001 | Tsuda et al. | |
| 6,478,871 B1 | 11/2002 | Shealy et al. | |
| 6,503,610 B2 | 1/2003 | Hiramatsu et al. | |
| 6,770,914 B2 | 8/2004 | Shibata et al. | |
| 7,473,315 B2 | 1/2009 | Nakahata et al. | |
| 8,981,403 B2 | 3/2015 | Shatalov et al. | |
| 9,105,792 B2 | 8/2015 | Jain et al. | |
| 9,397,260 B2 | 7/2016 | Jain et al. | |
| 9,680,061 B2 | 6/2017 | Jain et al. | |
| 2001/0003019 A1 | 6/2001 | Morita | |
| 2001/0004488 A1 | 6/2001 | Morita | |
| 2003/0047746 A1 | 3/2003 | Kuniyasu et al. | |
| 2003/0073315 A1 | 4/2003 | Morita | |
| 2004/0206299 A1 | 10/2004 | Tadatomo et al. | |
| 2005/0245095 A1 | 11/2005 | Haskell et al. | |
| 2006/0234486 A1 | 10/2006 | Speck et al. | |
| 2006/0286697 A1 | 12/2006 | Leem | |
| 2009/0166650 A1 | 7/2009 | Huang et al. | |
| 2009/0215248 A1 | 8/2009 | Nakahata et al. | |
| 2010/0032647 A1 | 2/2010 | Khan et al. | |
| 2010/0065854 A1 | 3/2010 | Kamber et al. | |
| 2010/0255621 A1 | 10/2010 | Minato et al. | |
| 2010/0327228 A1 | 12/2010 | Bando et al. | |
| 2011/0024880 A1 | 2/2011 | Li et al. | |
| 2011/0140072 A1 | 6/2011 | Varangis et al. | |
| 2011/0163295 A1 | 7/2011 | Wu et al. | |
| 2014/0167066 A1* | 6/2014 | Kashima | H01L 33/20 257/76 |
| 2016/0035936 A1 | 2/2016 | Jain et al. | |
| 2017/0104129 A1 | 4/2017 | Jain et al. | |

FOREIGN PATENT DOCUMENTS

| | | |
|---|---|---|
| JP | 2008211250 A | 9/2008 |
| JP | 2010219269 A | 9/2010 |
| KR | 20100059499 A | 6/2010 |

OTHER PUBLICATIONS

Lee, H., U.S. Appl. No. 15/797,263, Office Action1, dated Nov. 27, 2017, 15 pages.
Lee, H., U.S. Appl. No. 15/857,853, Office Action1, dated Feb. 8, 2018, 19 pages.
Ali et al., "Void shape control in GaN re-grown on hexagonally patterned mask-less GaN," Journal of Crystal Growth, 2011, 4 pages.
Bai et al., "Reduction of threading dislocation densities in AlN/sapphire epilayers driven by growth mode modification," Applied Physics Letters, 2006, 4 pages.
Byrappa et al., Crystal Growth Technology, Foreword, Preface, and Summaries of chapters 1-17, 2002, 11 pages.
Han et al., "Self-Assembled Periodic Silica Nanosphere Arrays on Wet-Etched Patterned Sapphire Substrate for a High-Light-Extraction-Effiiency Light-Emitting Diode," IEEE Electron Device Letters, Apr. 2011, 3 pages, vol. 32 No. 4.
Jain et al., "Migration enhanced lateral epitaxial overgrowth of AlN and AlGaN for high reliability deep ultraviolet light emitting diodes," Applied Physics Letters, 2008, 4 pages, vol. 93.
Lee et al., "InGaN-Based High-Power Flip-Chip LEDs With Deep-Hole-Patterned Sapphire Substrate by Laser Direct Beam Drilling," IEEE Electron Device Letters, Jul. 2010, 3 pages, vol. 31 No. 7.
Nishinaga et al., "Epitaxial Growth of III-V Compounds," 1988, 4 pages.
Nishinaga et al., "Epitaxial Lateral Overgrowth of GaAs by LPE," Japanese Journal of Applied Physics, Jun. 1988, 4 pages, vol. 27 No. 6.
Shen, et al., "Nitride-Based High-Power Flip-Chip LED With Double-Side Patterned Sapphire Substrate," IEEE Photonics Technology Letters, May 2007, 3 pages, vol. 19, No. 10.
Suihkonen et al., "Patterning of sapphire/GaN substrates," Physica Status Solidi C, 2011, 4 pages, No. 5.
Wuu et al., "Fabrication of Pyramidal Patterned Sapphire Substrates for High-Efficiency InGaN-Based Light Emitting Diodes," Journal of the Electrochemical Society, 2006, 6 pages, vol. 153, No. 8.
Lee, H., U.S. Appl. No. 13/647,885, Notice of Allowance, dated Mar. 18, 2016, 11 pages.
Lee, H., U.S. Appl. No. 13/647,885, Final Office Action, dated Jan. 11, 2016, 14 pages.
Lee, H., U.S. Appl. No. 13/647,885, Office Action, dated Oct. 1, 2015, 40 pages.
Lee, H., U.S. Appl. No. 15/212,659, Notice of Allowance, dated Feb. 7, 2017, 12 pages.
Lee, H., U.S. Appl. No. 15/212,659, Office Action, dated Sep. 15, 2016, 23 pages.
Lee, H., U.S. Appl. No. 15/389,479, Office Action1, dated Mar. 10, 2017, 26 pages.
Fulk, Steven, U.S. Appl. No. 13/647,902, Notice of Allowance, dated Apr. 7, 2015, 7 pages.
Fulk, Steven, U.S. Appl. No. 13/647,902, Office Action 1, dated Dec. 29, 2014, 25 pages.
Jain, et al, U.S. Appl. No. 14/822,508, Notice of Allowance, dated Feb. 28, 2017, 28 pages.

(56) References Cited

OTHER PUBLICATIONS

Jain, et al, U.S. Appl. No. 14/822,508, Office Action 1, dated Oct. 13, 2016, 28 pages.
Park, International Application No. PCT/US2012/059468, "International Search Report and Written Opinion," dated May 15, 2013, 14 pages.
Translation of Office Action of the Intellectual Property Office of Taiwan, Taiwan Application No. 101137532, dated Aug. 11, 2014, 3 pages.
Lee, H., U.S. Appl. No. 15/797,263, Notice of Allowance, dated Apr. 11, 2018, 15 pages.
Lee, H., U.S. Appl. No. 15/857,853, Notice of Allowance, dated Jul. 9, 2018, 13 pages.

* cited by examiner

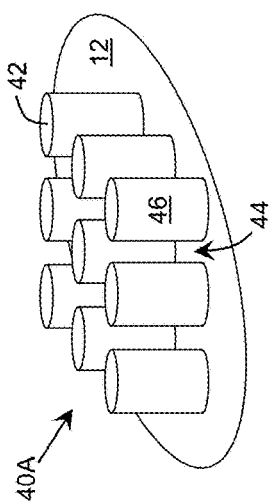
FIG. 6A
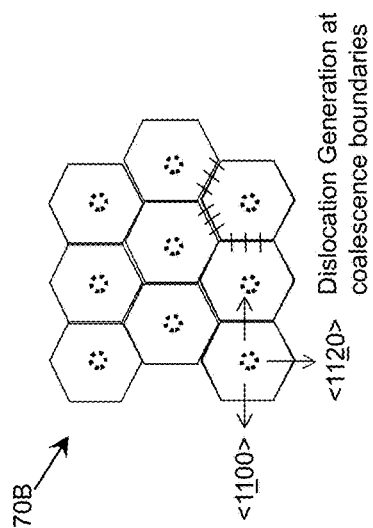
FIG. 6B
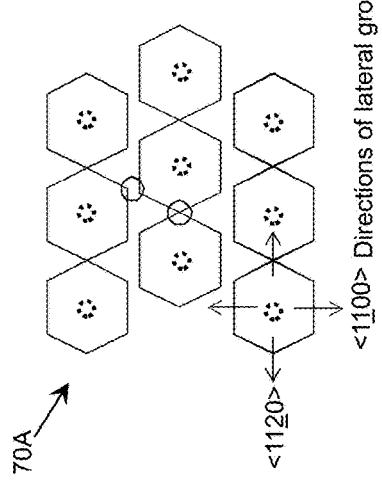
FIG. 7A
FIG. 7B

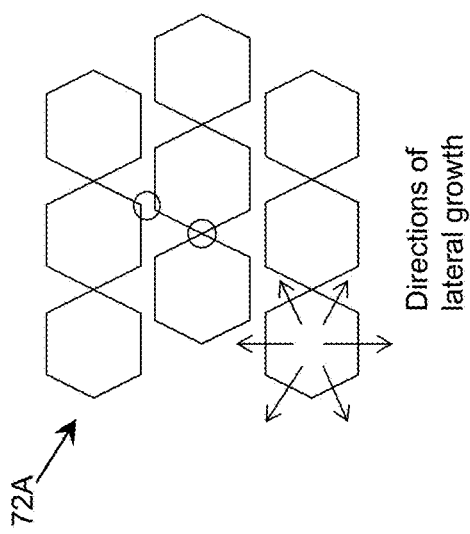
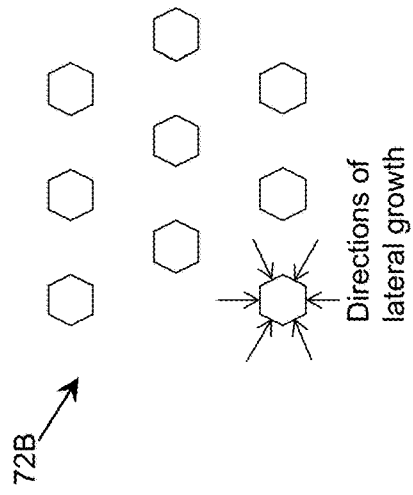

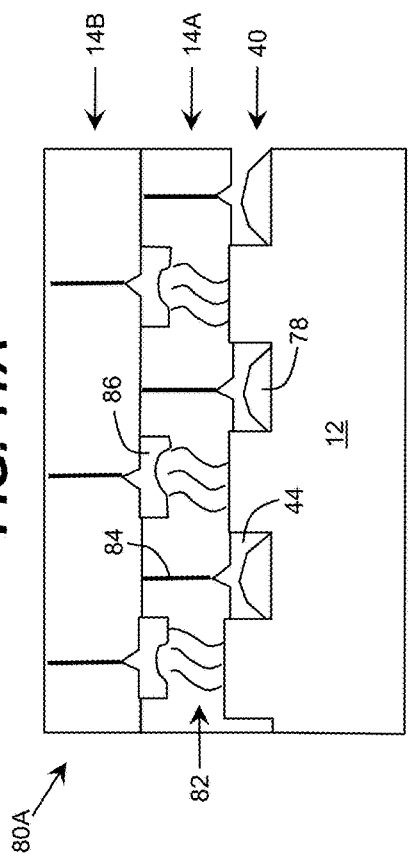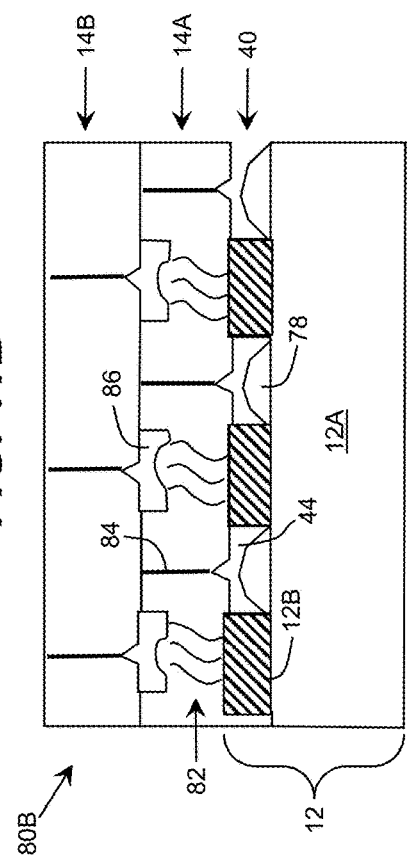

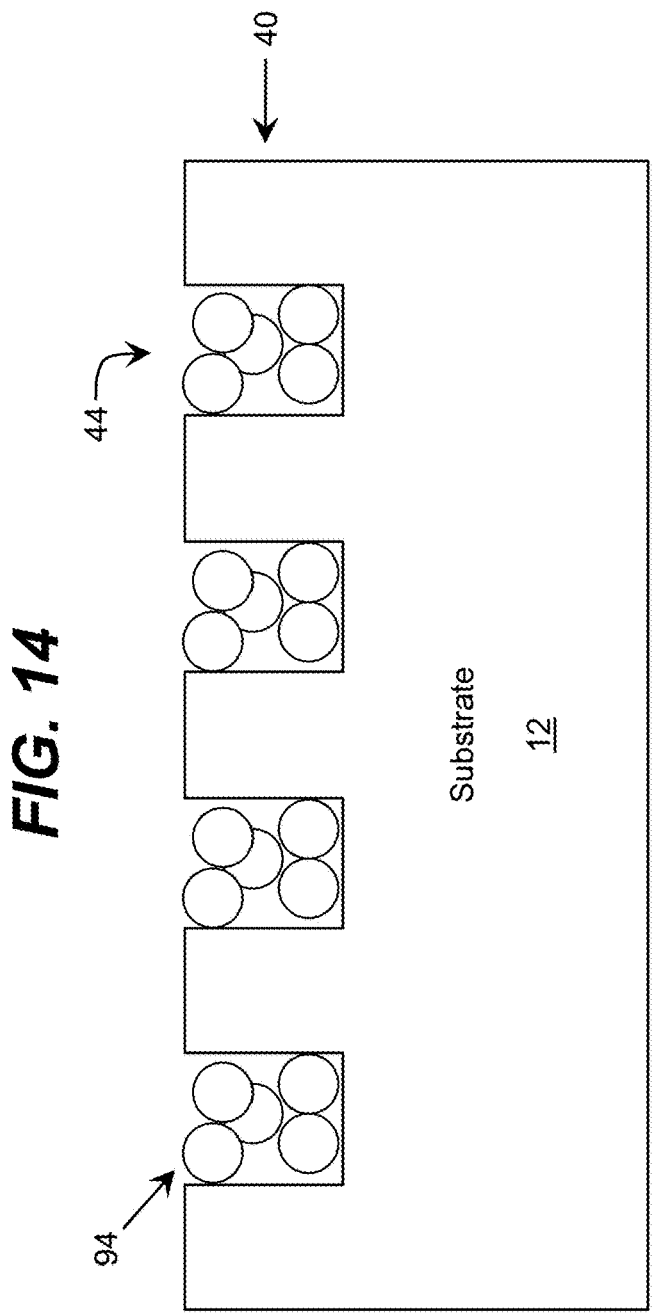

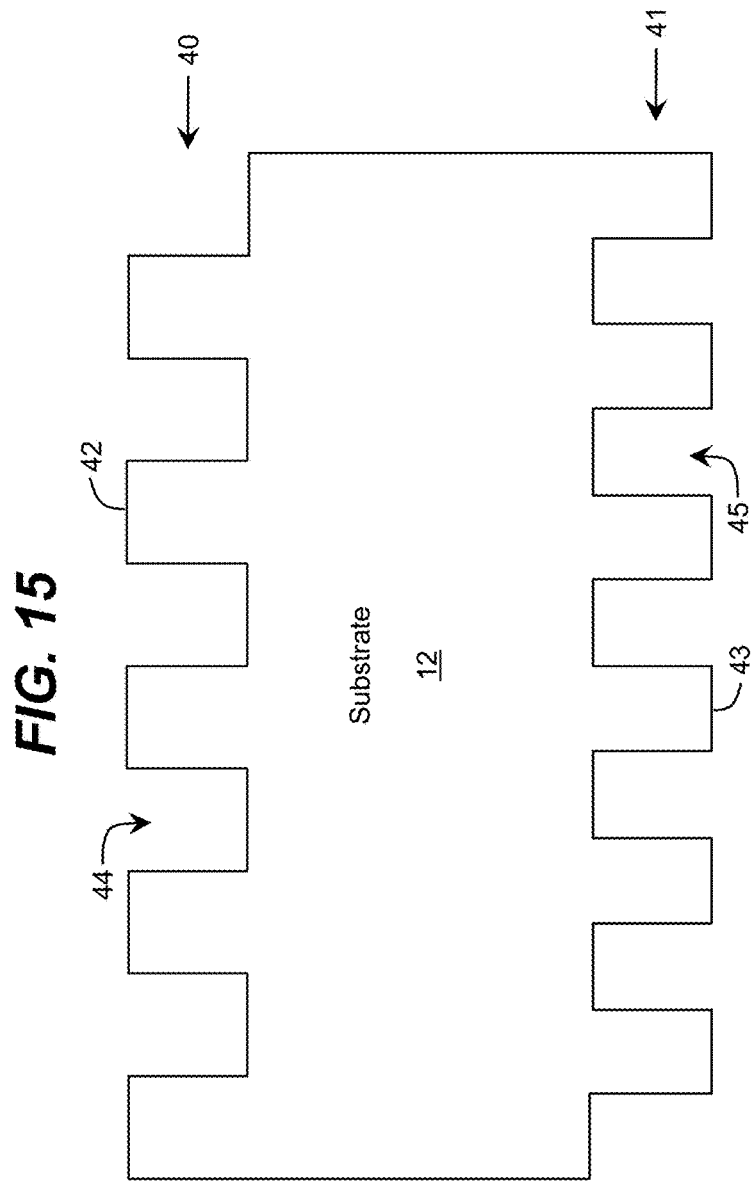

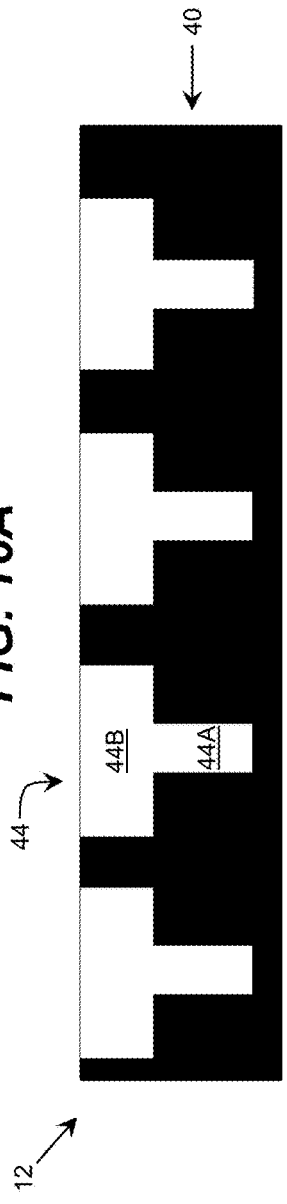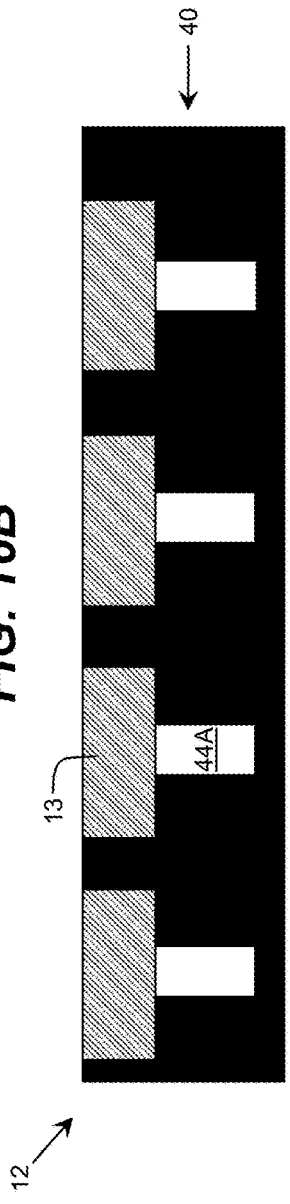

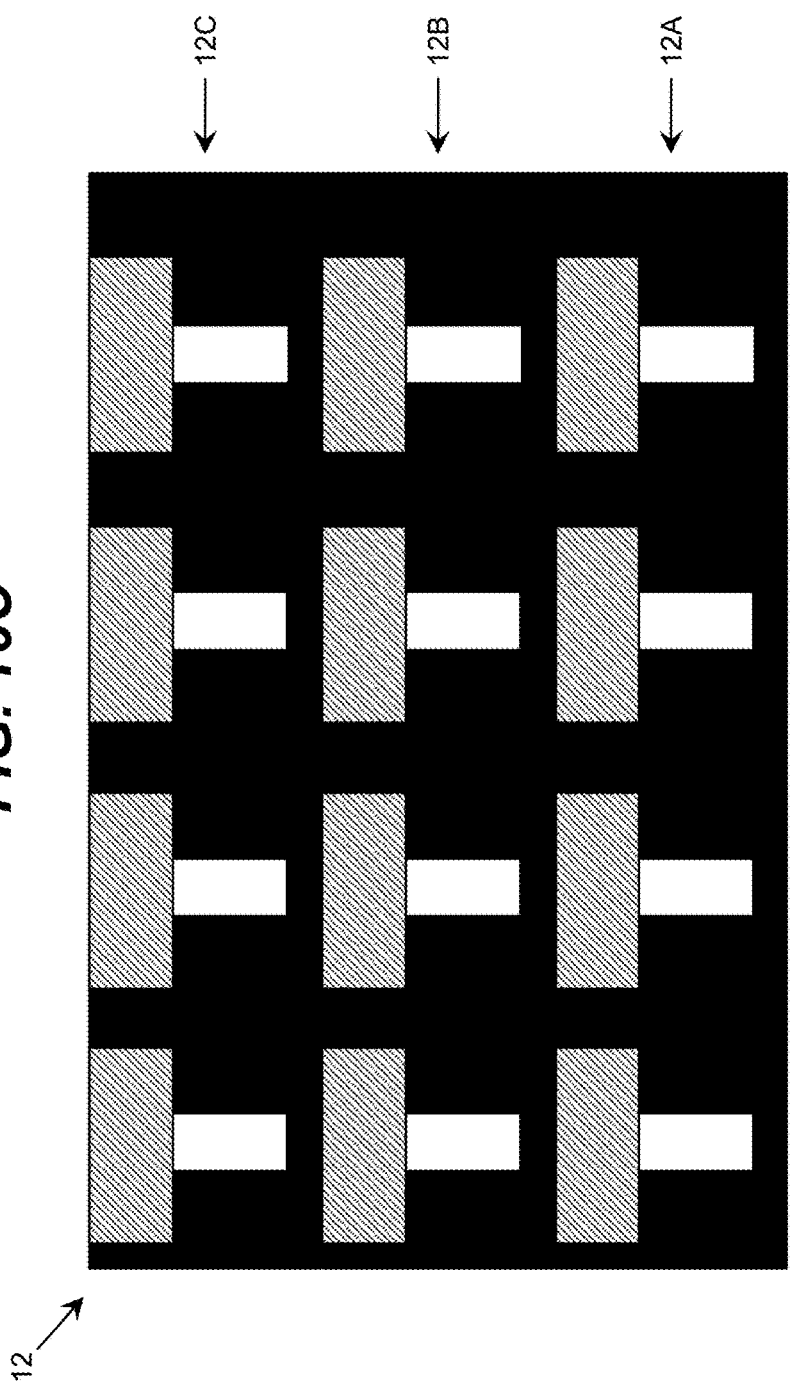

PATTERNED LAYER DESIGN FOR GROUP III NITRIDE LAYER GROWTH

REFERENCE TO RELATED APPLICATIONS

The current application is a continuation of U.S. patent application Ser. No. 14/822,508, filed 10 Aug. 2015, which is a continuation-in-part of U.S. patent application Ser. No. 13/647,902, filed on 9 Oct. 2012, which claims the benefit of U.S. Provisional Application No. 61/545,261, filed on 10 Oct. 2011, and U.S. Provisional Application No. 61/556,160, filed on 4 Nov. 2011, all of which are hereby incorporated by reference.

GOVERNMENT LICENSE RIGHTS

This invention was made with Federal government support under Contract No. W911NF-10-2-0023 awarded by Defense Advanced Research Projects Agency (DARPA). The government has certain rights in the invention.

TECHNICAL FIELD

The disclosure relates generally to semiconductor devices, and more particularly, to a design of a patterned substrate for layer growth, e.g., group III-nitride layer and emitting device growth.

BACKGROUND ART

For light emitting devices, such as light emitting diodes (LEDs), and especially deep ultraviolet light emitting diodes (DUV LEDs), minimizing a dislocation density in the semiconductor layers increases the efficiency of the device. To this extent, several approaches have sought to grow dislocation free semiconductor layers on patterned substrates. Some approaches have proposed various patterning of the underlying substrate. For example, FIGS. 1 and 2 show uses of an overgrowing technique according to the prior art. The technique of FIG. 1 uses patterning of convex protrusions on the underlying substrate and overgrowing a gallium nitride (GaN) semiconductor layer. In the approach of FIG. 2, buildup of semiconductor material in patterned depressions is allowed. A reduction of dislocations may result due to an overall reduction of stress in the semiconductor layer. Another approach uses patterned nanopillars to reduce stress of an epitaxial layer.

Other approaches have used microchannel epitaxy (MCE). FIG. 3 shows an illustration of microchannel epitaxy according to the prior art. In these approaches, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Another approach for controlling dislocations in aluminum nitride (AlN) and aluminum gallium nitride (AlGaN) layers first places seeds including dotted masks on the substrate or a template layer, and then grows the AlN or AlGaN layer over the substrate. The dislocations are attracted towards the center of the seeds and are accumulated there, thereby reducing the dislocation density at other portions of the layers.

SUMMARY OF THE INVENTION

Aspects of the invention provide a method of fabricating a device using a layer with a patterned surface for improving the growth of semiconductor layers, such as group III nitride-based semiconductor layers with a high concentration of aluminum. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the characteristic size of the stress reducing regions. A device including one or more of these features also is provided.

A first aspect of the invention provides a method comprising: obtaining a first layer having a substantially flat top surface with a root mean square roughness less than approximately 0.5 nanometers; forming a plurality of openings on the top surface, wherein the plurality of openings have a characteristic size between approximately 0.1 microns and approximately five microns and a depth of at least 0.2 microns and wherein the plurality of openings are separated by a distance less than or equal to the characteristic size; and growing a second layer directly on the top surface of the first layer, wherein the second layer is formed of a group III-nitride material having an aluminum concentration of at least seventy percent and having a thickness at least twice the characteristic size of the openings.

A second aspect of the invention provides a method of fabricating a light emitting device, the method comprising: obtaining a substrate having a substantially flat top surface with a root mean square roughness less than approximately 0.5 nanometers; forming a plurality of openings on the top surface, wherein the plurality of openings have a characteristic size between approximately 0.04 microns and approximately five microns and wherein the plurality of openings are separated by a distance less than or equal to the characteristic size; and growing a second layer directly on the top surface of the first layer, wherein the second layer is formed of a group III-nitride material having an aluminum concentration of at least seventy percent and having a thickness at least twice the characteristic size of the openings.

A third aspect of the invention provides a method comprising: obtaining a first layer having a substantially flat top surface with a root mean square roughness less than approximately 0.5 nanometers; forming a plurality of stress reducing regions on the top surface, wherein the plurality of stress reducing regions have a characteristic size between approximately 0.1 microns and approximately five microns and wherein the plurality of stress reducing regions are separated by a distance less than or equal to the characteristic size; and growing a second layer directly on the top surface of the first layer, wherein the second layer is formed of a group III-nitride material having an aluminum concentration of at least seventy percent and having a thickness at least twice the characteristic size of the openings.

A fourth aspect of the invention provides a device comprising: a first layer having a substantially flat top surface with a root mean square roughness less than approximately 0.5 nanometers, wherein the substantially flat top surface includes a first plurality of openings, wherein the first plurality of openings have a characteristic size between approximately 0.1 microns and approximately five microns and a depth of at least 0.2 microns, and wherein the first plurality of openings are separated by a distance less than or equal to the characteristic size; and a second layer directly adjacent to the top surface of the first layer, wherein the second layer is a group III-nitride material having an aluminum concentration of at least seventy percent and having a thickness at least twice the characteristic size of the openings.

A fifth aspect of the invention provides an optoelectronic device comprising: a substrate having a substantially flat top surface with a root mean square roughness less than approximately 0.5 nanometers, wherein the substantially flat top surface includes: a first plurality of openings, wherein the first plurality of openings have a characteristic size between approximately 0.1 microns and approximately five microns and a depth of at least 0.2 microns and less than a thickness of the substrate, and wherein the first plurality of openings are separated by a distance less than or equal to the characteristic size; and a second plurality of openings having a characteristic size smaller than the first plurality of openings, wherein the second plurality of openings have a characteristic size between approximately 40 nanometers and approximately 150 nanometers; and a buffer layer directly adjacent to the top surface of the substrate, wherein the buffer layer is a group III-nitride material having an aluminum concentration of at least seventy percent and having a thickness at least twice the characteristic size of the openings.

A sixth aspect of the invention provides a device comprising: a first layer having a substantially flat top surface with a root mean square roughness less than approximately 0.5 nanometers, wherein the substantially flat top surface includes a first plurality of openings, wherein the first plurality of openings have a characteristic size between approximately 0.1 microns and approximately five microns and a depth of at least 0.2 microns, and wherein the first plurality of openings are separated by a distance less than or equal to the characteristic size; and a second layer directly adjacent to the top surface of the first layer, wherein the second layer is a group III-nitride material having an aluminum concentration of at least seventy percent and having a thickness at least twice the characteristic size of the openings.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 6A and 6B show illustrative patterned surfaces according to embodiments.

FIGS. 7A and 7B show illustrative material coalescence patterns for growth using different patterning lattices over a patterned substrate according to an embodiment.

FIGS. 8A and 8B show illustrative material coalescence patterns for growth over the patterned substrates shown in FIGS. 6A and 6B, respectively, according to an embodiment.

FIGS. 11A and 11B show schematic diagrams illustrating a multistep formation procedure according to embodiments.

FIG. 14 shows a cross section of an illustrative substrate including filler material according to an embodiment.

FIG. 15 shows a cross section of an illustrative substrate according to an embodiment.

FIGS. 16-16D show cross sections of illustrative substrates including openings of varying widths according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a method of fabricating a device using a layer with a patterned surface for improving the growth of semiconductor layers, such as group III nitride-based semiconductor layers with a high concentration of aluminum. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the characteristic size of the stress reducing regions. A device including one or more of these features also is provided. As used herein, unless otherwise noted, the term "set" means one or more (i.e., at least one) and the phrase "any solution" means any now known or later developed solution.

Figure 1:
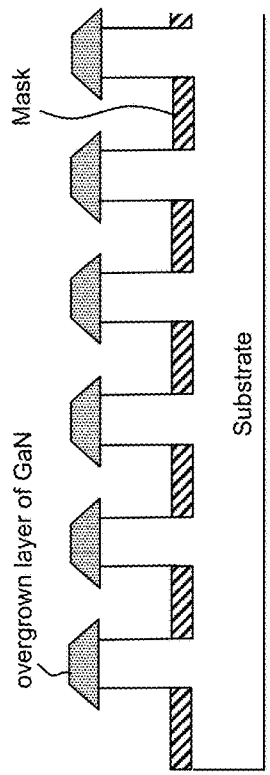
FIG. 1 shows use of an overgrowing technique according to the prior art.
Figure 2:
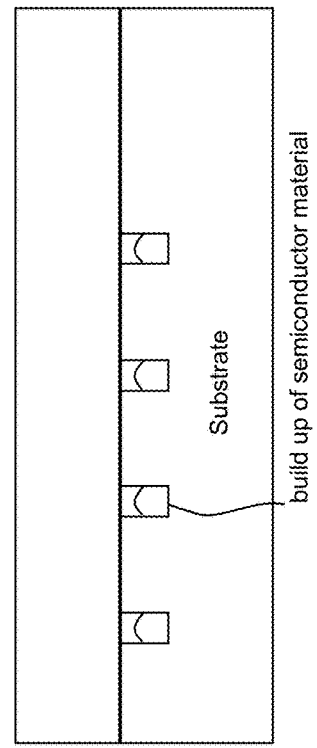
FIG. 2 shows another use of an overgrowing technique according to the prior art.
Figure 3:
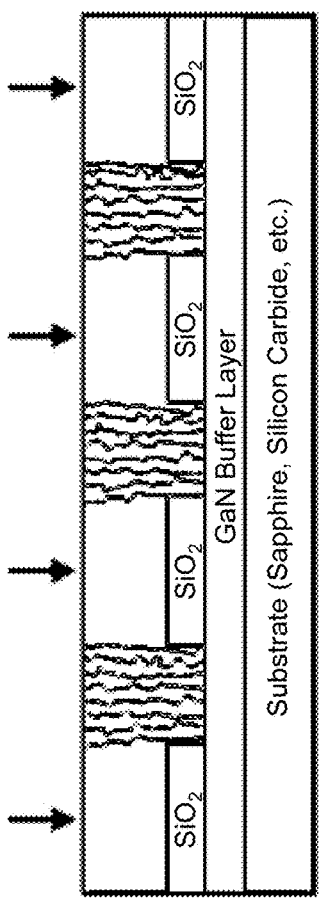
FIG. 3 shows an illustration of microchannel epitaxy according to the prior art.
Figure 4:
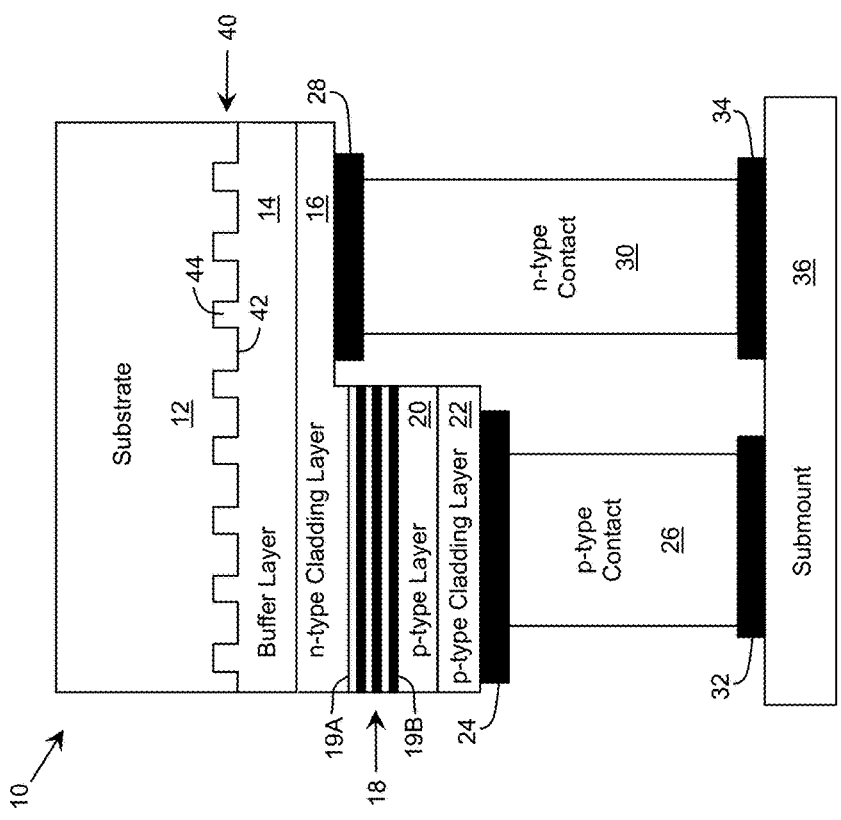
FIG. 4 shows a schematic structure of an illustrative emitting device according to an embodiment.

Turning to the drawings, FIG. 4 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_Y Al_X Ga_{1-x-y} N$, $Ga_Z In_Y Al_X B_{1-x-y-z} N$, an $Al_X Ga_{1-x} N$ semiconductor alloy, or the like. Similarly, both the n-type cladding layer 16 and the p-type layer 20 can be composed of an $In_Y Al_X Ga_{1-x-y} N$ alloy, a $Ga_Z In_Y Al_X B_{1-x-y-z} N$ alloy, or the like. The molar fractions given by x, y, and z can vary between the various layers 16, 18, and 20. The substrate 12 can be sapphire, silicon (Si), germanium, silicon carbide (SiC), a bulk semiconductor template material, such as AlN, GaN, BN, AlGaN, AlInN, AlON, $LiGaO_2$, AlGaBN, AlGaInN, AlGaInBN, and/or the like, or another suitable material, and can be polar, non-polar, or semi-polar. The buffer layer 14 can be composed of AlN, AlGaN, AlInN, AlGaBN, AlGaInN, AlGaInBN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength +/−five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. In a still more particular embodiment, an at least partially transparent layer is configured to allow more than approximately ten percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the n-type cladding layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Figure 5:
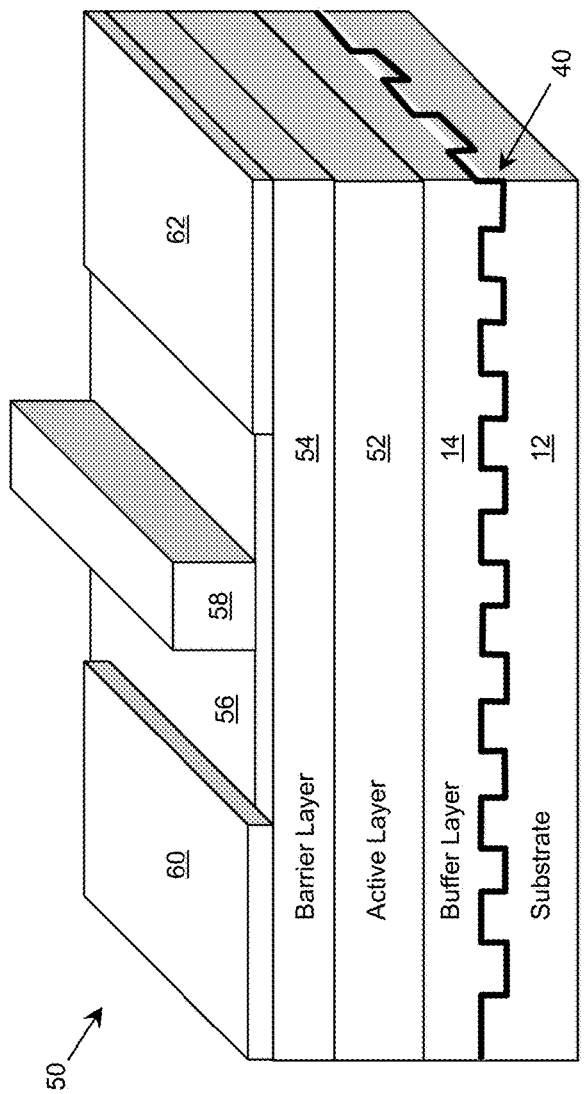
FIG. 5 shows a schematic structure of an illustrative heterostructure field effect transistor (HFET) according to an embodiment.

FIG. 5 shows a schematic structure of an illustrative heterostructure field effect transistor (HFET) 50 according to an embodiment. As illustrated, the HFET 50 can comprise a substrate 12, a buffer layer 14 formed thereon, an active layer 52 formed on the buffer layer 14, and a barrier layer 54 formed on the active layer 52. Additionally, the HFET 50 is shown including a gate passivation layer 56, on which a gate 58 is located, a source electrode 60, and a drain electrode 62. During operation of the HFET 50, the gate 58 can be used to control the flow of current along a device channel formed by the active layer 52 between the source electrode 60 and the drain electrode 62 using any solution.

In an embodiment, the HFET 50 is a group III-V materials based device, in which some or all of the various layers 14, 52, 54 are formed of elements selected from the group III-V materials system. In a more particular illustrative embodiment, the various layers of the HFET 50 are formed of group III nitride based materials as described herein. To this extent, the substrate 12 and the buffer layer 14 can be configured as described herein. In a still more particular illustrative embodiment, the active layer 52 is formed of GaN, and the barrier layer 54 is formed of AlInGaN. The gate passivation layer 56 can be formed of any type of dielectric material, such as silicon nitride ($Si_3N_4$), or the like. Each of the electrodes 62, 64 and the gate 58 can be formed of a metal.

While a light emitting device 10 (FIG. 4) and a HFET 50 are shown, it is understood that aspects of the invention can be utilized in the formation of any type of device. For example, the device can be any type of optoelectronic device, such as a light detecting device, a photodetector, as well as any of various types of electronic devices, such as various types of semiconductor diodes, semiconductor transistors (e.g., high electron mobility transistors), etc., and/or the like. Similarly, while aspects of the invention are shown and described with respect to growth of a layer on a substrate 12, it is understood that any junction between two layers in a device heterostructure can include a patterned surface 40 as described herein. Additionally, aspects of the invention can be applied to the manufacture of non-electronic devices. For example, aspects of the invention can be used in the manufacture of an optical device such as a lens.

Regardless, as illustrated in FIGS. 4 and 5, each device 10, 50 can include a substrate 12 having a patterned surface 40. The patterned surface 40 can be configured to: provide for relaxation of stress buildup between the substrate 12 and an adjacent layer, such as the buffer layer 14; yield a semiconductor layer, such as the buffer layer 14, having a lower density of dislocations; and/or the like. To this extent, the patterned surface 40 can enable the growth of a single crystal semiconductor layer thereon.

The patterned surface 40 can be specifically configured to grow AlN and AlGaN semiconductor layers with an aluminum concentration higher than approximately seventy percent. In an embodiment, the buffer layer 14 is formed of AlN and/or AlGaN, and has an aluminum concentration higher than approximately seventy percent. The patterned surface 40 can comprise a set of top surfaces, such as the top surface 42, and a plurality of openings 44, which disrupt a continuity of the set of top surfaces 42. As described herein, each of the set of top surfaces 42 can be substantially flat, which can be configured to provide a set of epi-ready (e.g., ready for epilayer growth) top surfaces 42 for growth of the buffer layer 14. For example, for a substrate 12 formed of sapphire and a buffer layer 14 formed of aluminum nitride, the set of top surfaces 42 can have a root mean square roughness that is less than approximately 0.5 nanometers.

FIGS. 6A and 6B show illustrative patterned surfaces 40A, 40B according to embodiments. In FIG. 6A, the patterned surface 40A is formed by a plurality of protruding regions, such as the region 46, and a plurality of openings 44 between the protruding regions 46. Each protruding region 46 can have a substantially flat top surface 42 (e.g., a root mean roughness less than approximately 0.5 nanometers). As used herein, the top surface 42 of a protruding region 46 refers to the surface of the region 46 that is furthest from the substrate 12 and on which an adjacent layer will be formed. In an embodiment, a characteristic size (e.g., diameter) of the plurality of protruding regions 46 is between approximately 0.1 microns and approximately 5.0 microns. Furthermore, a characteristic size of the plurality of openings 44 between the plurality of protruding regions 46 can have a size less than or equal to the characteristic size of the plurality of protruding regions 46.

In FIG. 6B, the patterned surface 40B is formed by a plurality of openings 44 (e.g., depressions) present in a top surface 42 of the substrate 12. Each opening 44 can have a substantially vertical wall and a substantially flat bottom surface. For example, the bottom surface of the openings 44 and/or the top surface 42 of the substrate can have a root mean square roughness that is less than approximately 0.5 nanometers. In an embodiment, a characteristic size (e.g., diameter) of the openings 44 is between approximately 0.1 microns and approximately five microns. Furthermore, the openings 44 can be spaced from one another by gaps having a size less than approximately twice a diameter of the openings 44. In a more particular embodiment, the gaps have sizes less than approximately a diameter of the openings. In an embodiment, the openings 44 can have substantially circular cross sections and be formed in a lateral hexagonal pattern. However, it is understood that the openings 44 can comprise any combination of one or more of various types/shapes of cross-sectional patterns and form any type of pattern.

The patterned surfaces 40A, 40B can be formed using any solution. For example, for a substrate 12 formed of sapphire, AlN, or the like, the patterned surfaces 40A, 40B can be formed using a combination of lithography and etching. In an embodiment, the patterned surfaces 40A, 40B are formed using photolithography and wet chemical etching. However, it is understood that other types of lithography, such as e-beam, stepper, and/or the like, and/or other types of etching, such as dry etching, can be used.

During fabrication of a device 10 (FIG. 4), 50 (FIG. 5), a semiconductor layer, such as the buffer layer 14 (FIGS. 4 and 5), can be formed directly on the patterned surface 40 of the substrate 12. As described herein, the buffer layer 14 can have a high aluminum content (e.g., greater than seventy percent). For optimized growth conditions of AlN, $Al_xGa_{1-x}N$ with a high value for x (e.g., greater than 0.7), and the like, the material has a much lower ratio of lateral to vertical growth rates (1:2) as compared to GaN (>>1:1). As a result, to achieve lateral growth of AlN of one micron, the layer thickness must be increased by at least two microns. This leads to significant stress accumulation and wing tilt of the laterally overgrown material, which, in turn, causes the generation of defects (e.g., dislocations) after coalescence.

FIGS. 7A and 7B show illustrative material coalescence patterns 70A, 70B for growth using different patterning lattices over a patterned substrate according to an embodiment. In each case, the material can comprise AlN or AlGaN and the patterned substrate is formed using the convex protruding regions 46 as shown in FIG. 6A. In the material coalescence pattern 70A, coalescence starts at the corners of neighboring hexagons (indicated by circles), which creates boundaries for possible stress relaxation through the generation of dislocations or cracks. In the material coalescence pattern 70B, coalescence occurs along the sides of the neighboring hexagons, where stress relaxation can occur through the generation of dislocations or cracks.

FIGS. 8A and 8B show illustrative material coalescence patterns 72A, 72B for growth over the patterned substrates 40A, 40B shown in FIGS. 6A and 6B, respectively, according to an embodiment. In each case, the material being grown can comprise AlN, AlGaN, or the like. As discussed herein, for growth over the patterned substrate 40A, the material coalescence pattern 72A includes various locations where dislocations and/or cracks can form. In contrast, for growth over the patterned substrate 40B, a majority of the surface can be flat, which is particularly suitable for epitaxial growth of AlN or AlGaN. As a result, the use of the patterned substrate 40B for the growth of these materials results in coalescence taking place primarily in a single point, thereby reducing an effect of dislocation regeneration and relaxation/cracking.

Figure 9:
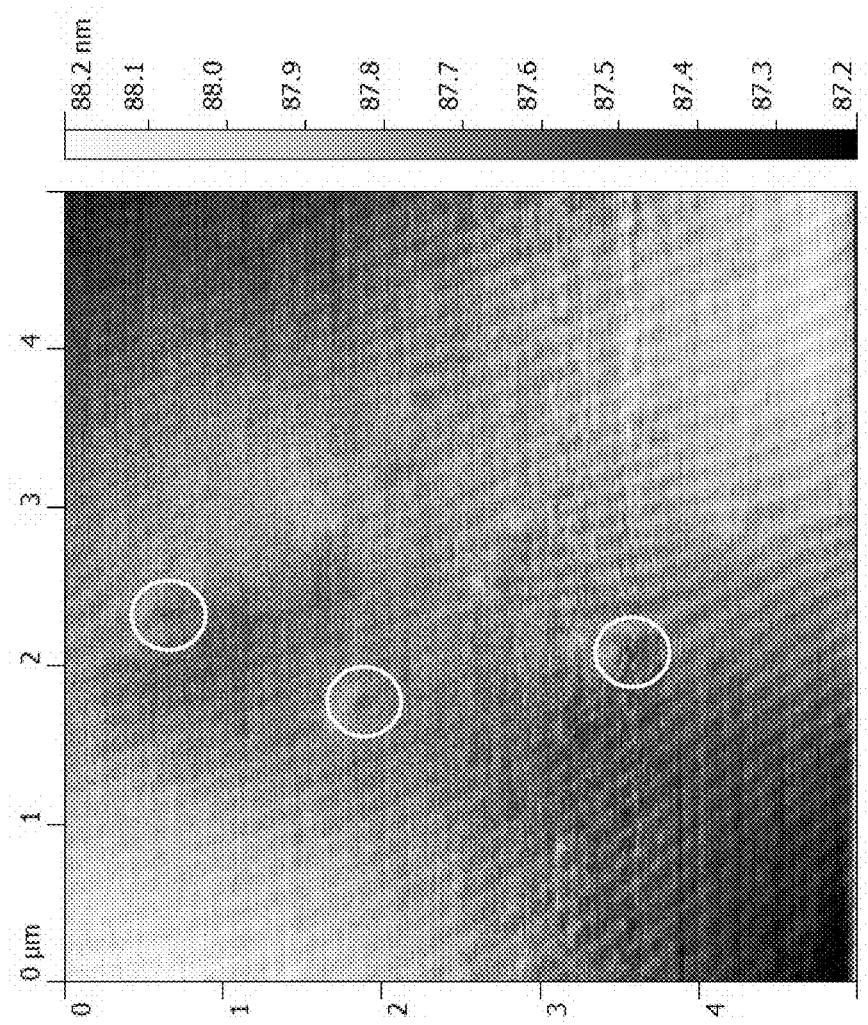
FIG. 9 shows an atomic force microscope (AFM) scan of an AlN or AlGaN layer grown on the patterned substrate of FIG. 6B according to an embodiment.

To this extent, the use of the patterned substrate 40B can provide a better surface for promoting the coalescence of laterally grown AlN and AlGaN than use of the patterned substrate 40A. In particular, the patterned surface 40B can include small features (e.g., concave depressions) and a dense pattern to promote coalescence of laterally grown AlN, AlGaN, and/or the like. FIG. 9 shows an atomic force microscope (AFM) scan of an AlN or AlGaN layer grown on the patterned substrate 40B according to an embodiment. The dots (some of which are circled in the figure) on the AFM scan indicate locations where the coalescence of dislocations has been achieved. The AFM root mean square (RMS) for the coalescence of the layer is less than 0.2 nanometers.

Figure 10:
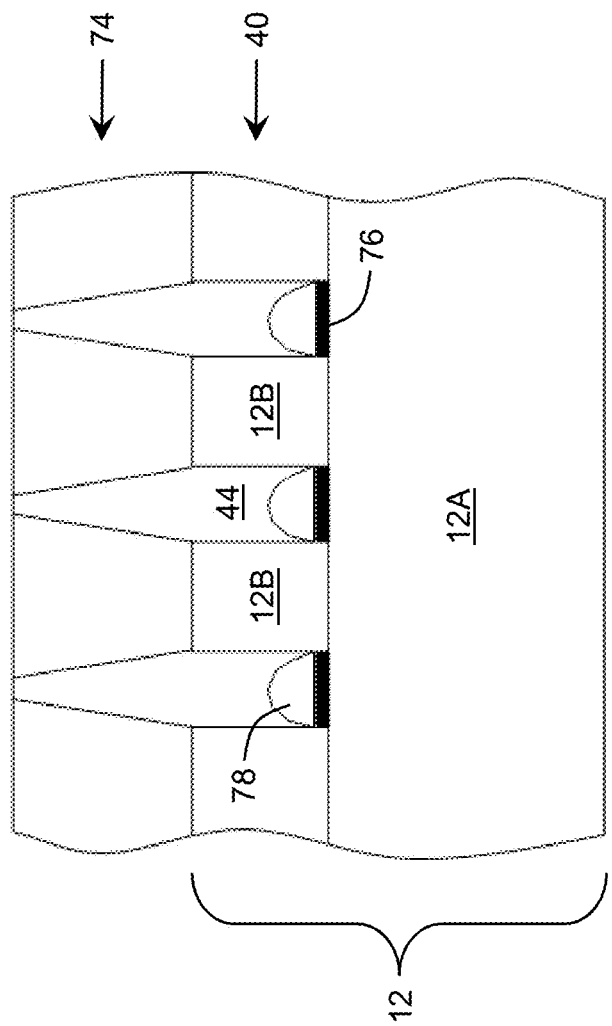
FIG. 10 shows an illustrative cross section of AlN material growth over a patterned substrate according to an embodiment.

FIG. 10 shows an illustrative cross section of AlN material 74 growth over a patterned substrate 40 according to an embodiment. As illustrated, the patterned substrate 40 includes a plurality of openings 44, each of which can include a mask 76 located on a bottom surface thereof. The patterned substrate 40 can be formed using a composite substrate 12. For example, the substrate 12 can include a layer of a first material 12A, such as sapphire or the like, on which a template layer 12B including the various openings 44 formed therein is formed. The template layer 12B can comprise any type of suitable material for a growth initiation layer, such as AlN, AlGaN, or the like. The mask 76 can be any amorphous or polycrystalline material, including but not limited to silicon dioxide, silicon nitride, and the like. During growth of the AlN material 74, some polycrystalline material 78, can grow in the openings 44. The mask 76 can be configured to promote such growth. However, the openings 44 can be configured such that the overgrowth of the AlN material 74 occurs prior to the openings 44 filling with the polycrystalline material 78. In an embodiment, the openings 44 can have a diameter that is less than one half of a thickness of the semiconductor layer of material 74 being grown thereon. Furthermore, the openings 44 can have a depth of at least 0.2 microns.

In an embodiment, one or more layers of the heterostructure can be formed using a multistep patterning and growing, e.g., epitaxy/etch, procedure. The multistep formation procedure can enable dislocations to be filtered out as the layer is grown. For example, FIGS. 11A and 11B show schematic diagrams 80A, 80B illustrating a multistep formation procedure according to embodiments. In the diagram 80A, the substrate 12 includes a single layer of material (e.g., sapphire, AlGaN buffer, and/or the like), which has a patterned surface 40. In the diagram 80B, a composite substrate 12 is used, which includes a layer of a first material 12A (e.g., sapphire, AlGaN, and/or the like), and a template layer 12B formed thereon, which includes a pattern of openings 44 as described herein to form the patterned surface 40.

In either case, a first sub-layer 14A can be grown over the patterned surface 40. The sub-layer 14A can include one or more high dislocation regions 82, one or more dislocations 84 due to coalescence of adjacent regions, and/or the like. After growing the first sub-layer 14A, a top surface of the sub-layer 14A can be patterned with a set of stress reducing regions, such as a second plurality of openings 86. The openings 86 can be formed such that the openings 86 are vertically offset from the openings 44 in the patterned surface 40. For example, the openings 86 and the openings 44 can form a vertical checkerboard arrangement. In this manner, the growth of a layer can include multiple levels of openings, where adjacent levels of openings are vertically shifted with respect to one another. In an embodiment, each level of openings is formed using a mask, which is vertically shifted with respect to the underlying layer forming a periodic structure with at least two sub-layers 14A, 14B.

Figure 12:
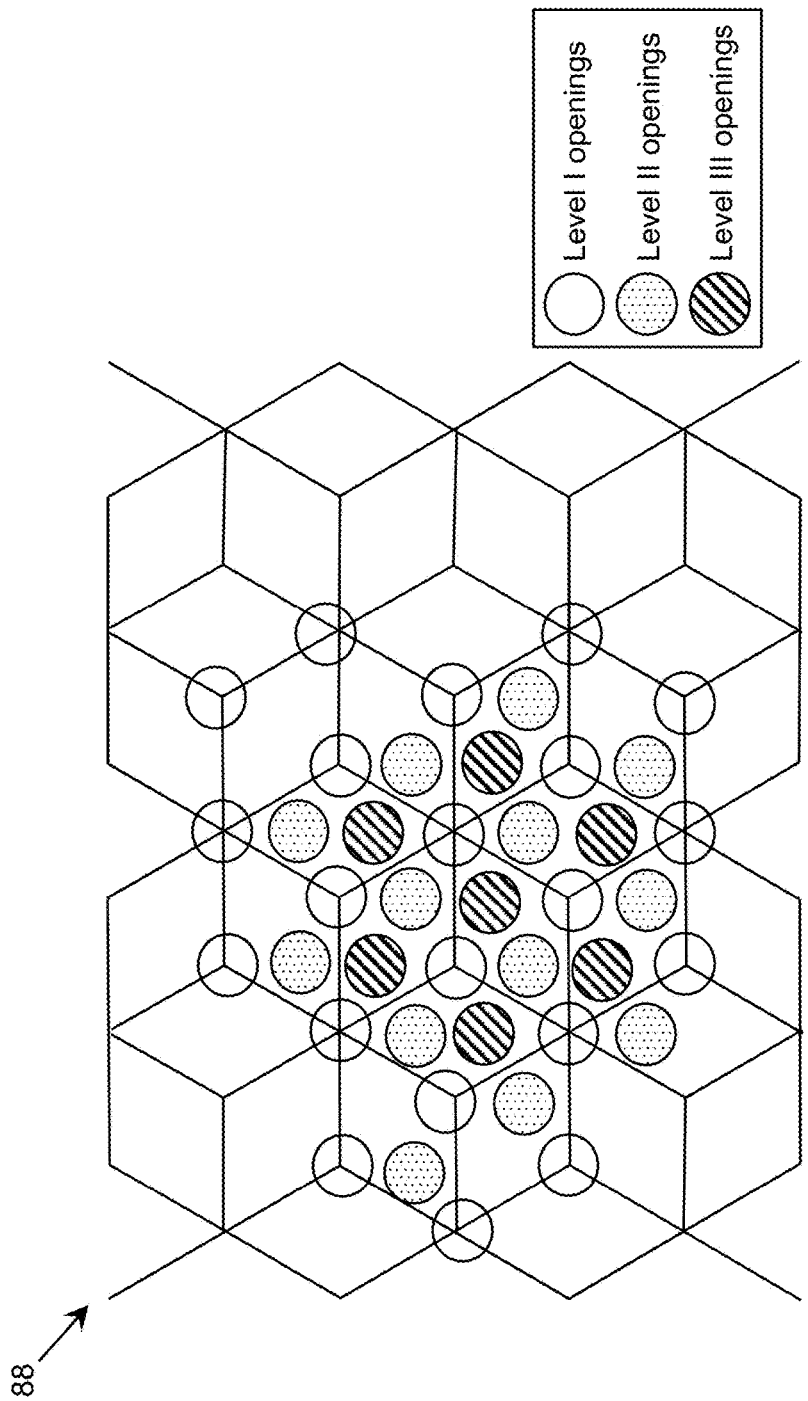
FIG. 12 shows a top view of an illustrative layer formed using multiple sub-layers according to an embodiment.

In an embodiment, multiple patterns can be used in forming a layer (e.g., a unique pattern for each sub-layer 14A, 14B). The patterns can form any of two Bravais lattices, which can form either multilayer Bravais structures, polytypes, or the like, where symmetry and/or periods can change from one sub-layer to the next. FIG. 12 shows a top view of an illustrative layer 88 formed using multiple sub-layers according to an embodiment. The layer 88 can be formed of an AlN/AlGaN material using a multistep patterning and growing, e.g., epitaxy/etch, procedure and a close packed patterning lattice. Additionally, each level can include a pattern of openings having a lateral hexagonal arrangement. As illustrated, such a lattice enables placement of the patterned openings for one level to be located between the patterned openings of a previous level and formation of an overall hexagonal close-packed three dimensional arrangement.

Figure 13:
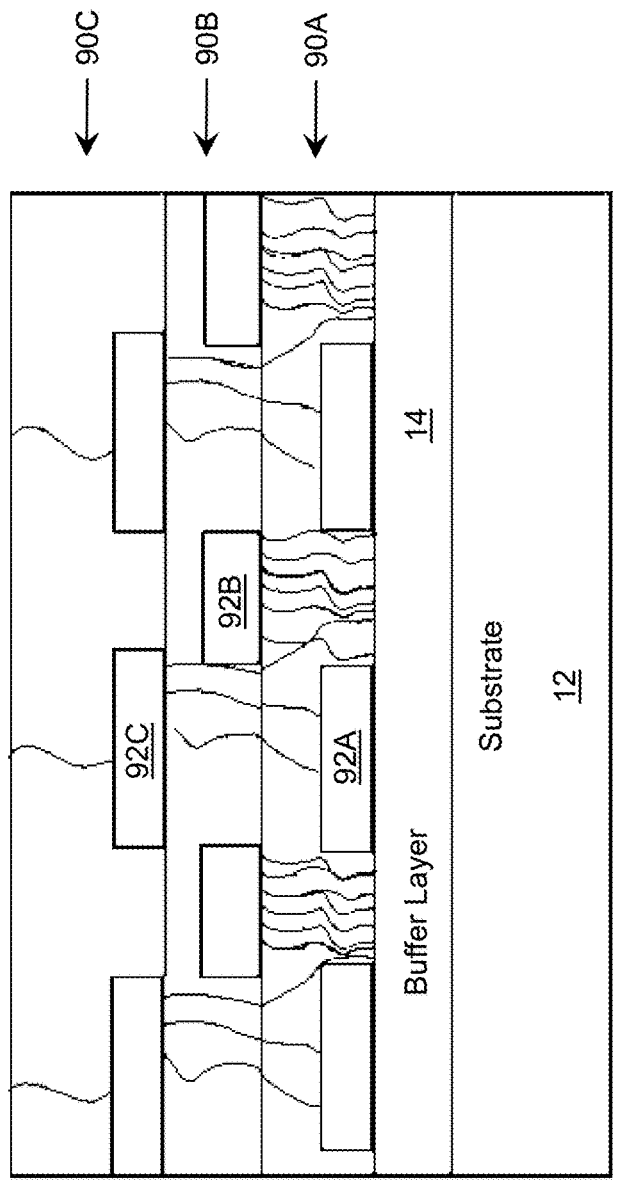
FIG. 13 shows a schematic diagram of an illustrative multistep layer formation according to another embodiment.

While aspects of the invention have been primarily described with respect to the use of openings to provide a roughening pattern for relaxation of stress buildup, a lower density of dislocations, and/or the like, it is understood that alternative solutions can be used to provide stress reducing regions. To this extent, FIG. 13 shows a schematic diagram of an illustrative multistep layer formation according to another embodiment. In this case, the roughening pattern includes a set of masks 92A, which are formed on the buffer layer 14 prior to growth of a first sub-layer 90A. The masks 92A enable the growth of low dislocation regions in the regions of the sub-layer 90A located above the masks 92A. After growth of the sub-layer 90A, a second set of masks 92B are formed thereon, and a second sub-layer 90B is grown. As illustrated, the second set of masks 92B can be vertically offset from the first set of masks 92A, and can block high dislocation regions, which can form between the masks 92A, from further vertically propagating. Similarly, a third set of masks 92C can be formed on the second sub-layer 90B and a third sub-layer 90C can be grown thereon. As can be seen, a number of dislocations within the sub-layer 90C can be substantially lower than a number of dislocations present in the lowest sub-layer 90A.

The substrate 12 can be sapphire, the buffer layer 14 can be AlN, AlGaN, or the like, and each of the sub-layers 90A-90C can be formed of AlN, GaN, AlGaN, or the like. The masks 92A-92C can be formed of any material having a low affinity for aluminum adatoms. For example, the masks 92A-92C can be formed of carbon or a carbon based material, such as graphite, graphene, nanocrystalline diamond, or the like. While three sub-layers 90A-90C are shown, it is understood that any number of sub-layers 90A-90C can be grown. Furthermore, while the sets of masks 92A-92C are shown including two alternating patterns of masks, it is understood that any number of mask patterns can be used to form a periodic pattern of any number of dimensions (e.g., one, two, or three). While the multistep patterning process is shown and described in conjunction with growing a single layer of a heterostructure, it is understood that the process can be used to grow multiple layers of the heterostructure. For example, each sub-layer can be a distinct layer of the heterostructure rather than a portion of a layer.

In an embodiment, a set of openings formed on a surface of a substrate can be at least partially filled with a material prior to growth of a layer thereon. For example, FIG. 14 shows a cross section of an illustrative substrate 12 including filler material 94 according to an embodiment. As illustrated, the substrate 12 includes a patterned surface 40 including a plurality of openings 44 as described herein. To this extent, any embodiment described herein can include the filler material 94. At least some of the openings 44 in the patterned surface 40 can be at least partially filled with a filler material 94. The filler material 94 can comprise any type of filler material 94 suitable for use. For example, in an embodiment, the filler material 94 comprises nanoparticles. The filler material 94 can be formed of any material, such as a group III nitride (e.g., aluminum nitride, aluminum gallium nitride, etc.), sapphire, and/or the like. In an embodiment, the filler material 94 can be configured to provide scattering of electromagnetic radiation passing through the patterned surface 40, which can, for example, increase an overall extraction efficiency of a light emitting device.

A substrate described herein can include one or more additional features, which can be configured to improve one or more other aspects of the substrate and/or corresponding device. For example, when a substrate described herein is incorporated into an optoelectronic device, the substrate can include one or more features to facilitate the transmission of electromagnetic radiation through the substrate. To this extent, FIG. 15 shows a cross section of an illustrative substrate 12 according to an embodiment. As described herein, the substrate 12 can include a patterned surface 40 including a set of top surfaces 42 and a plurality of openings 44, which can be configured to provide a set of epi-ready (e.g., ready for epilayer growth) top surfaces 42 for growth of a layer thereon (e.g., a buffer layer).

Similarly, an opposing side of the substrate 12 can include a patterned surface 41 including a set of top surfaces 43 and a plurality of openings 45. However, the patterned surface 41 can be configured to facilitate the transmission of electromagnetic radiation through the patterned surface 41. To this extent, one or more attributes of the patterned surface, such as a period of openings 45, a characteristic width/depth of the openings 45, a roughness of the top surfaces 43 and/or openings 45, and/or the like, can be selected based on an index of refraction of the substrate 12 and/or the ambient environment adjacent to the substrate 12 (e.g., air). For example, in an embodiment, the openings 45 and have a period and size, which provides variation of the patterned surface 41 having a characteristic scale greater than a target wavelength of electromagnetic radiation passing there through (e.g., a peak wavelength of the radiation desired to pass through the patterned surface 41) during operation of the corresponding device. In a more particular embodiment, the characteristic scale of the variation is approximately an order of magnitude (e.g., ten times) larger than the target wavelength. Additionally, the set of top surfaces 43 and/or surfaces of the openings 45 can have a roughness having a characteristic scale on the order of the target wavelength (e.g., between approximately ten to two hundred percent of the target wavelength).

Similarly, the patterned surface 40 can be configured to facilitate the transmission of electromagnetic radiation through the patterned surface 40, in addition to reducing stress in epitaxial layers and promoting epitaxial growth with reduced number of dislocations. For example, one or more attributes of the patterned surface 40, such as a period of openings 44, a characteristic width/depth of the openings 44, and/or shape of the openings 44, and/or the like, can be selected based on an index of refraction of the substrate 12, the index of refraction of a layer epitaxially grown thereon (e.g., an AlN semiconductor layer), and/or the like.

Figure 16D:
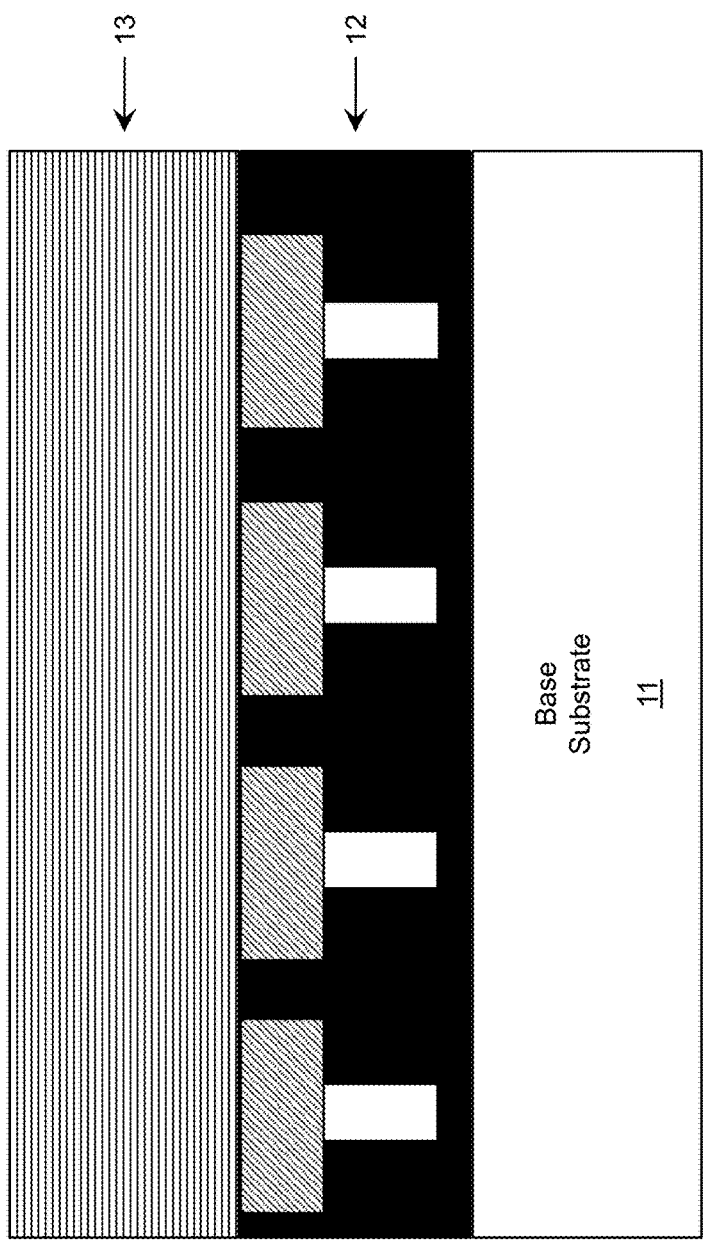

While the openings described herein have been shown as being substantially uniform in shape, it is understood that openings can have a more complex shape. To this extent, FIGS. 16A-16D show cross sections of illustrative substrates 12 including openings 44 of varying widths according to embodiments. In FIG. 16A, the substrate 12 includes a patterned surface 40 configured for growth of a semiconductor layer thereon. The patterned surface 40 includes a plurality of openings 44 as described herein. One or more of the openings 44 has a width that varies based on depth. For example, an opening 44 can have a first region 44A having a first width and a second region 44B having a second width significantly larger than the first width. As shown, the second region 44B can be located closer to the growth surface. For example, the first region 44A can have a width in a range between five and fifty percent a width of the second region 44B. The second region 44B can have a width between fifty nanometers to a few tens of microns. In an embodiment, the second region 44B has a width of approximately one micron.

As shown in FIG. 16B, a semiconductor layer 13 can be selectively grown over the openings 44, e.g., in the second region 44B of the openings 44. In this case, the first region 44A of an opening 44 can form a cavity. The semiconductor layer 13 can be formed of any suitable material, such as a group III nitride material (e.g., aluminum nitride, aluminum gallium nitride, gallium nitride, indium aluminum gallium nitride, and/or the like). The substrate 12 can comprise any suitable substrate material described herein. When the substrate 12 is formed of a semiconductor material, such as a bulk semiconductor template material, a process of forming openings can be repeated multiple times during growth of the substrate 12. For example, FIG. 16C shows an illustrative substrate 12 including three sub-regions 12A-12C, each including openings having varying widths and selectively overgrown material as described herein. While three sub-regions 12A-12C are shown, it is understood that a substrate 12 can include any number of two or more sub-regions 12A-12C. In a more particular embodiment, the openings in the sub-regions 12A-12C are configured to form a three-dimensional photonic crystal.

It is understood that various alternative configurations of a substrate 12 including multiple sub-regions 12A-12C are possible. For example, one or more of the sub-regions 12A-12C can be formed of a short period superlattice including alternating sub-layers of differing materials. Similarly, a sub-region 12A-12C can be formed of a substantially uniform material or a graded material. In an embodiment, sub-regions formed of short period superlattices are alternated with sub-regions formed of a uniform and/or graded material. In another illustrative embodiment, only a top sub-region 12C is formed of a short period superlattice. Still further, the material forming each sub-region 12A-12C can be changed along a height of the substrate 12. For example, an aluminum molar fraction of each sub-region 12A-12C can progressively increase, thereby making the top sub-region 12C more conducive for growth of aluminum nitride thereon. Furthermore, one or more attributes of the openings of the patterned surface of each sub-region 12A-12C can vary between sub-regions 12A-12C. For example, a distance between the patterning stripes (e.g., a width of the openings) can vary from sub-region 12A-12C to sub-region 12A-12C. Additionally, the patterned surface of a single sub-region, such as the sub-region 12C, can form a two-dimensional photonic crystal and be different from the remaining patterned surface(s) of the remaining sub-region(s) 12A, 12B.

In an embodiment, a substrate described herein is used as a sacrificial layer for fabrication of a device heterostructure. To this extent, FIG. 16D shows a substrate 12 being used as a sacrificial layer according to an embodiment. In this case, a base substrate 11, such as sapphire, can be fabricated/obtained, and the sacrificial substrate 12 can be grown thereon. The sacrificial substrate 12 can be formed of any material suitable for subsequent growth of a heterostructure 13 for a device as described herein. As illustrated, the sacrificial substrate 12 can include selectively overgrown openings of varying widths as described herein. However, it is understood that any substrate described herein can be utilized. Regardless, after formation of the heterostructure 13, the sacrificial substrate 12 can be removed, e.g., through laser ablation, or the like. In this manner, both the base substrate 11 and the sacrificial substrate 12 will be detached from the device heterostructure 13 prior to operation of the corresponding device.

Figure 17:
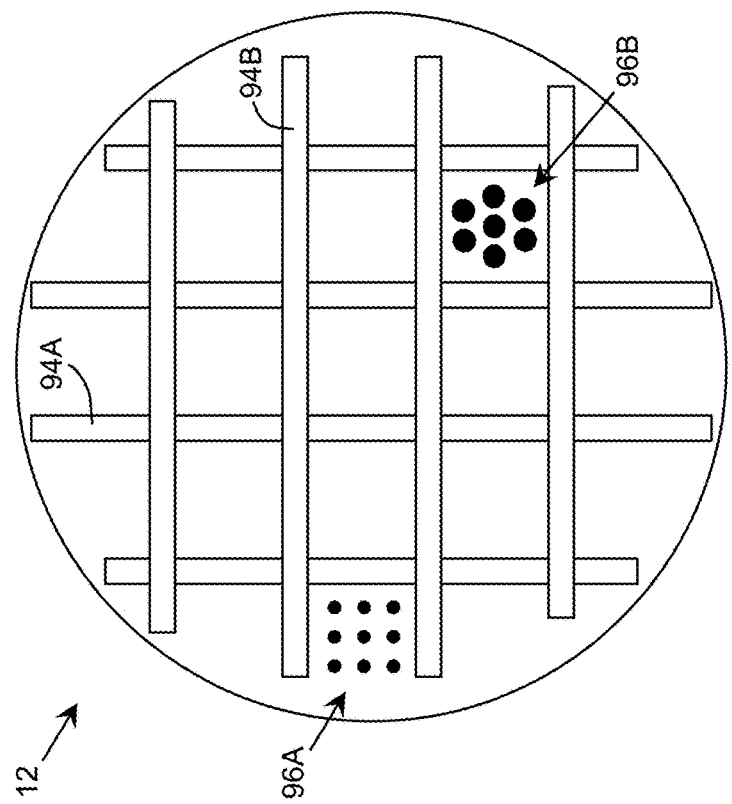
FIG. 17 shows a top view of an illustrative patterned surface of a substrate according to an embodiment.

In an embodiment, a surface of a substrate 12 can include multiple patterns. For example, FIG. 17 shows a top view of an illustrative patterned surface of a substrate 12 according to an embodiment. In this case, the substrate 12 includes a plurality of stripes, such as stripes 94A and 94B, of an isolating material. The isolating material can comprise silicon dioxide, silicon nitride, a carbon based material, or any amorphous or polycrystalline material. As illustrated, the stripes 94A, 94B can form a plurality of regions, such as regions 96A and 96B, each of which is isolated from another region by the stripes 94A, 94B. Each region 96A, 96B can comprise a patterned surface configured as described herein. Furthermore, the plurality of regions 96A, 96B can include patterned surfaces formed using a different solution and/or having different attributes. In this manner, each region 96A, 96B can comprise a configuration, which is suitable for stress reduction through lateral epitaxial overgrowth, selective area growth, selective polycrystalline growth, and/or the like.

In an embodiment, one or more aspects of the pattern are configured based on radiation desired to pass through the corresponding interface. For example, a characteristic size of the pattern, a distance between the patterning regions (e.g., openings or masks), a depth of the pattern (e.g., opening or mask depth), and/or the like, can be selected based on a target wavelength of the radiation. In an embodiment, the distance between adjacent masks or openings can be greater than the target wavelength. Furthermore, a characteristic size of the opening or mask can be in a range from approximately 0.25 times to approximately five times the distance between adjacent masks or openings. The target wavelength can be selected based on a peak wavelength of radiation desired to pass through the patterned surface(s) during operation of a device, such as the device 10 (FIG. 4), and can be within any range of wavelengths, including visible light, ultraviolet radiation, deep ultraviolet radiation, infrared light, and/or the like. In an embodiment, the target wavelength corresponds to the peak wavelength of the radiation generated in the active region 18 (FIG. 4) of the device 10.

Furthermore, one or more patterned surfaces described herein can be configured to form a photonic crystal in the lateral and/or vertical directions of a heterostructure. Additionally, a patterned surface described herein can be configured to increase a scattering of diffusive light between the substrate and a semiconductor layer or between adjacent semiconductor layers. Similarly, one or more attributes of a pattern, such as a density of the openings/masks, a characteristic size, and/or the like, can vary laterally or between patterns spaced vertically to provide, for example, a gradient in an effective refractive index of the resulting layer(s), control of the refractive index, manipulate the deflection of radiation passing through the structure, and/or the like.

Figure 18:
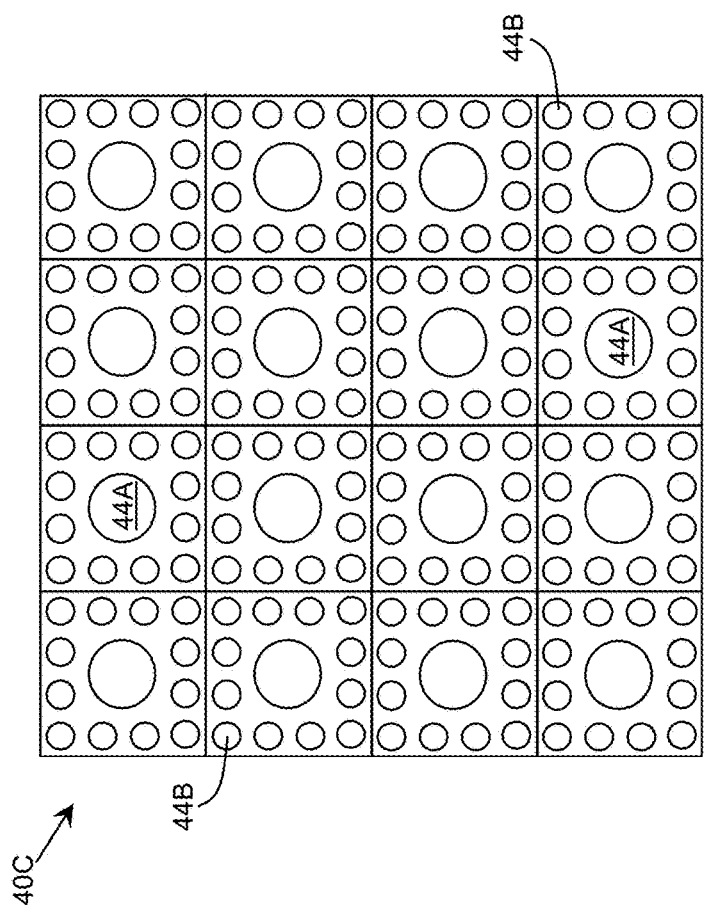
FIG. 18 shows an illustrative patterned surface according to an embodiment.

For example, FIG. 18 shows an illustrative patterned surface 40C according to an embodiment. In this case, the patterned surface 40C includes two distinct scales. In particular, a set of large scale openings 44A (e.g., micron size openings) can be included and configured to improve a quality of the semiconductor layers grown over the patterned surface 40C, e.g., by reducing a number of dislocations present in the semiconductor layers. Furthermore, a set of small scale openings 44B (e.g., nano size openings such as in a range between approximately 40-150 nanometers) can be included and configured based on at least one light propagation property for the device, e.g., to improve and/or adjust one or more attributes of light propagation (e.g., extraction) to/from the semiconductor layers. To this extent, the small scale openings 44B can be formed in a periodic structure. Additionally, the small scale openings 44B can comprise lattice constants in lateral and/or vertical directions that are different than the lattice constants corresponding to the large scale openings 44A. In an embodiment, the set of large scale openings 44A has a periodic pattern defined by a Bravais set of lattice constants L1 and the set of small scale openings 44B has a periodic pattern defined by a Bravais set of lattice constants L2, where at least some elements of the set L2 are different from the corresponding elements of the set L1. Alternatively, the large scale openings 44A and/or the small scale openings 44B can be aperiodic.

Returning to FIGS. 4 and 5, it is understood that a device 10, 50, or a heterostructure used in forming a device 10, 50, including one or more patterned surfaces 40 as described herein, can be fabricated using any solution. For example, a device/heterostructure can be manufactured by obtaining (e.g., forming, preparing, acquiring, and/or the like) a substrate 12, forming the patterned surface 40 of the substrate (e.g., by etching, growing a template layer, and/or the like), and forming (e.g., growing) another layer thereon. In an embodiment, the growth of one or more layers of the heterostructure includes periodic growth of self-assembly structures on a patterned surface. The growth of such structures can be implemented by varying one or more growth conditions (e.g., a growth temperature), a ratio of elements (e.g., group V/group III ratio), and/or the like. Such a growth process can modulate an internal strain in epilayers and result in a substantially crack-free semiconductor (e.g., group III nitride) layer. Additionally, it is understood that the formation of any combination of one or more layers of the device can include forming one or more patterned surfaces 40 as described herein. Furthermore, one or more metal layers, contacts, and/or additional layers can be formed using any solution. The heterostructure/device also can be attached to a submount via contact pads using any solution.

It is understood that the fabrication of the emitting device/heterostructure can include the deposition and removal of a temporary layer, such as mask layer, the patterning one or more layers, such as the substrate 12 as described herein, the formation of one or more additional layers not shown, and/or the like. To this extent, a patterned surface 40 can be fabricated using any combination of deposition and/or etching. For example, the fabrication can include selective deposition and/or etching of nanoscale objects, such as nanodots and/or nanorods, and/or micro-scale objects, such as micro-holes, of the material to form a patterned surface described herein. Such deposition and/or etching can be used to form periodic and/or non-periodic random patterns.

The patterning of a layer, such as the substrate 12, can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

Figure 19:
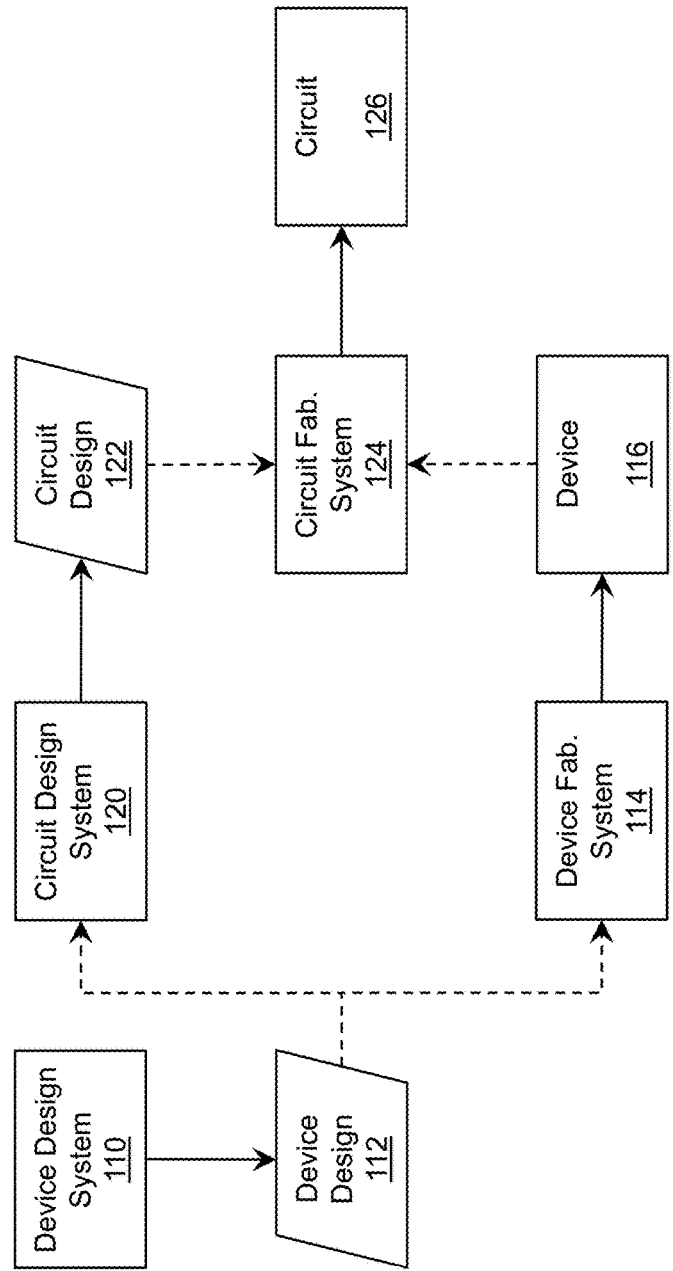
FIG. 19 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 19 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
a substrate having a top surface with a root mean square roughness less than approximately 0.5 nanometers, wherein the top surface is a continuous surface that includes a plurality of periodically spaced openings arranged in a two-dimensional pattern, wherein the plurality of periodically spaced openings have a characteristic size between approximately 0.1 microns and approximately five microns and a depth of at least 0.2 microns, and wherein the plurality of periodically spaced openings are separated by a distance less than or equal to the characteristic size; and
a buffer layer directly adjacent to the top surface of the substrate, wherein the buffer layer is a group III-nitride material having an aluminum concentration of at least seventy percent and having a thickness at least twice the characteristic size of the plurality of periodically spaced openings, wherein the plurality of periodically spaced openings are at least partially unfilled between the substrate and the buffer layer.

2. The device of claim 1, wherein the plurality of periodically spaced openings are arranged in a lateral hexagonal pattern.

3. The device of claim 1, wherein the substrate is sapphire.

4. The device of claim 1, wherein a top surface of the buffer layer has a root mean square roughness less than 0.2 nanometers.

5. The device of claim 1, further comprising a group III nitride semiconductor layer located on the buffer layer, wherein the group III nitride semiconductor layer has an aluminum concentration different from the aluminum concentration of the buffer layer.

6. The device of claim 5, wherein the group III nitride semiconductor layer includes a plurality of sub-layers, the plurality of sub-layers including:

a first sub-layer directly adjacent to the buffer layer, the first sub-layer having a substantially flat top surface with a root mean square roughness less than approximately 0.5 nanometers;
a first plurality of stress reducing regions on the top surface of the first sub-layer; and
a second sub-layer directly adjacent to the top surface of the first sub-layer.

7. The device of claim 1, wherein the plurality of periodically spaced openings are only partially filled with polycrystalline material.

8. The device of claim 1, wherein the plurality of periodically spaced openings are only partially filled with a filler material configured to provide scattering of electromagnetic radiation passing through the top surface.

9. The device of claim 1, wherein the device is configured to be operated as a light emitting device, and wherein at least one of: the characteristic size of the plurality of periodically spaced openings, the depth of the plurality of periodically spaced openings, or the distance between the plurality of periodically spaced openings is less than a wavelength of the radiation emitted during operation of the light emitting device.

10. The device of claim 1, wherein the device is an optoelectronic device, and wherein a bottom surface of the substrate is patterned to facilitate the transmission of electromagnetic radiation through the bottom surface.

11. The device of claim 10, wherein the bottom surface includes a plurality of bottom openings providing variation having a characteristic scale greater than a wavelength of the electromagnetic radiation.

12. An optoelectronic device comprising:
a substrate having a top surface with a root mean square roughness less than approximately 0.5 nanometers, wherein the top surface is a continuous surface that includes a plurality of periodically spaced openings arranged in a two-dimensional pattern, wherein the plurality of periodically spaced openings have a characteristic size between approximately 0.1 microns and approximately five microns and a depth of at least 0.2 microns, and wherein the plurality of periodically spaced openings are separated by a distance less than or equal to the characteristic size;
a buffer layer directly adjacent to the top surface of the substrate, wherein the buffer layer is a group III-nitride material having an aluminum concentration of at least seventy percent and having a thickness at least twice the characteristic size of the plurality of periodically spaced openings, wherein the plurality of periodically spaced openings are at least partially unfilled between the substrate and the buffer layer; and
an active region located above the buffer layer, wherein the active region comprises a group III-nitride material.

13. The optoelectronic device of claim 12, wherein the active region is configured to emit ultraviolet light during operation of the optoelectronic device.

14. The optoelectronic device of claim 12, wherein the plurality of periodically spaced openings are only partially filled with a filler material configured to provide scattering of electromagnetic radiation passing through the top surface.

15. The optoelectronic device of claim 12, wherein the plurality of periodically spaced openings are arranged in a lateral hexagonal pattern.

16. The optoelectronic device of claim 12, wherein a bottom surface of the substrate is patterned with a pattern providing variation having a characteristic scale greater than a wavelength of electromagnetic radiation corresponding to operation of the optoelectronic device.

17. An optoelectronic device comprising:

a sapphire substrate having a top surface with a root mean square roughness less than approximately 0.5 nanometers, wherein the top surface includes a plurality of periodically spaced openings, wherein the plurality of periodically spaced openings have a characteristic size between approximately 0.1 microns and approximately five microns and a depth of at least 0.2 microns, and wherein the plurality of periodically spaced openings are separated by a distance less than or equal to the characteristic size;

a buffer layer directly adjacent to the top surface of the substrate, wherein the buffer layer is a group III-nitride material having an aluminum concentration of at least seventy percent and having a thickness at least twice the characteristic size of the plurality of periodically spaced openings, wherein the plurality of periodically spaced openings are only partially filled with polycrystalline material; and an active region located above the buffer layer, wherein the active region comprises a group III-nitride material configured to emit or sense ultraviolet radiation during operation of the optoelectronic device.

18. The optoelectronic device of claim 17, wherein the plurality of periodically spaced openings are arranged in a lateral hexagonal pattern.

19. The optoelectronic device of claim 17, wherein the top surface is a continuous surface, and wherein the plurality of periodically spaced openings are arranged in a two-dimensional pattern.

20. The optoelectronic device of claim 17, wherein a bottom surface of the substrate is patterned with a pattern providing variation having a characteristic scale greater than a wavelength of the ultraviolet radiation.

* * * * *